United States Patent [19]
Toyoda et al.

[11] Patent Number: 5,397,740
[45] Date of Patent: Mar. 14, 1995

[54] METHOD OF MAKING AN OPTICAL SEMICONDUCTOR DEVICE

[75] Inventors: Yukio Toyoda, Tokyo; Shinichi Wakabayashi; Hitomaro Tougou, both of Kawasaki, all of Japan

[73] Assignee: Matsushita Electric Industrial Co., Ltd., Osaka, Japan

[21] Appl. No.: 213,456

[22] Filed: Mar. 14, 1994

Related U.S. Application Data

[62] Division of Ser. No. 55,384, May 3, 1993, abandoned.

[30] Foreign Application Priority Data

May 12, 1992 [JP] Japan ................. 4-118688

[51] Int. Cl.6 ............................................. H01L 21/20
[52] U.S. Cl. .................... 437/129; 437/905; 148/DIG. 95
[58] Field of Search ............... 372/26, 43, 45, 46, 372/47, 50; 437/129, 905; 148/DIG. 95

[56] References Cited

U.S. PATENT DOCUMENTS

| | | | |
|---|---|---|---|
| 4,408,330 | 10/1983 | An | 372/45 |
| 4,700,353 | 10/1987 | Van Gieson et al. | 372/45 |
| 5,084,894 | 1/1992 | Yamamoto | |
| 5,202,896 | 4/1993 | Taylor | 372/50 |
| 5,224,115 | 6/1993 | Taylor et al. | 372/50 |

FOREIGN PATENT DOCUMENTS 77486 5/1985 Japan .................... 437/129
387086 4/1991 Japan .

OTHER PUBLICATIONS

Yamanishi et al. "Quantum Mechanical Size Effect Modulation Light Sources—A New Field Effect Semiconductor Laser or Light Emitting Device," Japanese J. Appl. Phys. vol. 22, No. 1, Jan. 1983 pp. L22–L24.

T. Sasaki, et al "Semiconductor Photonic Integrated Circuit for High-Density MDM Light Sources", Preliminary Report 4-149 for 1990 Autumn Meeting by the Association of Electronic Data Communication.

Primary Examiner—Robert Kunemund
Assistant Examiner—Linda J. Fleck
Attorney, Agent, or Firm—Stevens, Davis, Miller & Mosher

[57] ABSTRACT

First and second junctions are set so as to control electric fields applied to an active layer, independent from each other, and the electric field applied by the first junction controls exciting conditions while the electric field applied by the second junction drives the active layer so as to simplify a drive circuit for an optical semiconductor device.

1 Claim, 5 Drawing Sheets

METHOD OF MAKING AN OPTICAL SEMICONDUCTOR DEVICE

This application is a divisional of application Ser. No. 08/055,384, filed May 3, 1993, now abandoned.

BACKGROUND OF THE INVENTION

The present invention relates to an optical semiconductor device which is widely used in the fields of optical communication, optical data processing and the like.

PRIOR ART OF THE INVENTION

Optical semiconductor devices are used, for example, in a variable wavelength laser. Further, a typical one of the conventional variable wavelength laser is disclosed in a preliminary report 4-149 for "1990 Autumn Meeting" by the Association of Electronic Data Communication.

Referring to FIG. 8 which is a sectional view showing a conventional optical semiconductor device, in the direction of a wave guide thereof, when current is injected from a four electrode tandem type DBR laser, the effective refractive index of a diffraction grating part 75 of a DBR area 73 is changed so that the resonant frequency of the DBR laser can be changed. In this device, a third current charge into a phase control area 72 is required for adjustment, and further, a modulating layer 74 should be provided, in addition to a laser active layer 71.

In the above-mentioned typical example in the conventional technical field, as shown in FIG. 8, current injection is required for the phase control area 72 for adjusting the phase of laser in addition to current injection to the DBR area 73 for changing the wavelength of laser since no constant output can be obtained if no phase adjustment is made. Accordingly, current injection into the phase control area 72 should be precisely adjusted for balance. Further, not only extremely precise adjustments are individually required for stable operation but also precise temperature control is required. The direct modulation by current injection to the active area 71 cannot be made since the balance operation is sensitive, and accordingly, a modulation signal is separately inputted into an additionally formed modulation area 74 using variation in absorptance caused by an electrical field as shown in the figure.

Thus, since the above-mentioned device is a composite element including four units, there are serious problems in that complicated circuitry, extremely precise adjustment and precise temperature control are required. It is noted that other conventional devices similar to the above-mentioned typical example, offer problems similar to those as mentioned above.

SUMMARY OF THE INVENTION

The present invention is devised in order to solve the above-mentioned problems, and accordingly one object of the present invention is to provide an optical semiconductor device having a novel structure for wavelength variable laser, which has a high performance under stable operation, which can simplify its drive circuit and which can eliminate the necessity of precise adjustment and precise temperature control.

Further, another object of the present invention is to provide an optical semiconductor device in which drive and laser exciting conditions are controlled in one and the same active area so that the drive control circuit thereof can be simplified while individual precise adjustment is not required. Accordingly, the optical semiconductor device according to the present invention has a high degree of integration and a high degree of reliability in compassion with conventional optical semiconductor devices in which the laser exciting conditions are adjusted and controlled in an area other than the active area.

To the end, according to the present invention, two junctions independent from each other are provided so as to commonly use an active area, for driving the active area and for controlling the laser exciting conditions. That is, two independent first and second junctions which commonly use an active area are provided so that a voltage is applied to the first junction in order to control the condition of the active area while current is injected from the second junction into the active layer in order to excite the laser.

In particular, the above-mentioned first junction is provided in parallel with the surface of a substrate on which epitaxial layers including an active area are formed while the second junction is provided, perpendicular to the surface thereof. With this arrangement, electrical fields which are orthogonal to each other can be produced, for controlling and driving one and the same active layer, independently.

Further, according to the present invention, a method of producing an optical semiconductor device, which comprises the steps of growing an n-type buffer layer on an n-type substrate, further growing, on the n-type buffer layer, an n-type clad layer, a quantum well layer, a p-type clad layer and a p-type cap layer in the mentioned order so as to form a ridge by etching, and growing an undoped layers on the n-type buffer on opposite sides of the ridge growing an n-type layer and an n-type cap layer in the mentioned order on the undoped layer on one side of the ridge, similarly growing a p-type layer and a p-type cap layer on the undoped layer on the other side of the ridge, providing electrodes for a first junction on the p-type cap layer at the top of the ridge and the bottom surface of the n-type substrate, and providing electrodes for a second junction on the p-type and n-type cap layers on both sides of the ridge, respectively, whereby the first junction is set in parallel to the surface of the substrate while the second junction is set, perpendicular to the surface thereof, through the intermediary of the quantum well layer.

More specifically, a multiple quantum well layer having a quantizing confinement Stark effect is used as an active layer so as to enhance its quantum effect in comparison with a single quantum well layer.

The present invention will be detailed in an embodiment form of the present invention with reference to the drawings in which:

BRIEF DESCRIPTION OF THE DRAWINGS

FIGS. 3a to 3c are views showing the operational configuration of the optical semiconductor device shown in FIG. 1; in which FIG. 3a is a schematic sectional view showing a condition in which current is injected from the second junction in an active layer of the optical semiconductor device, FIG. 3b is a schematic sectional view showing a condition in which a control voltage is applied to the active layer, and FIG. 3c is an enlarge view showing an essential part in FIG. 3b;

DESCRIPTION OF PREFERRED EMBODIMENTS

Figure 1:
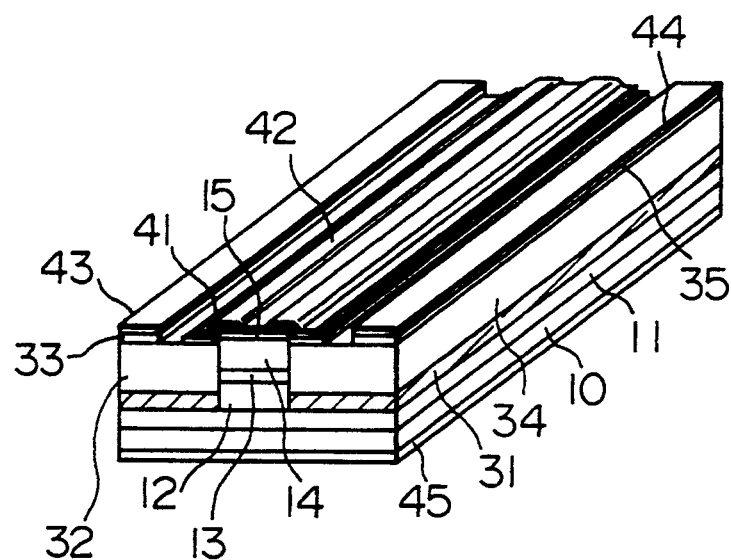
FIG. 1 is a perspective view illustrating an optical semiconductor device in one embodiment of the present invention.
Figure 2:
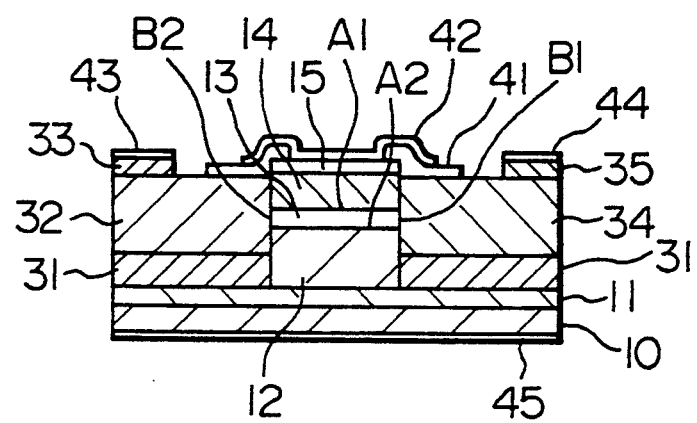
FIG. 2 is a sectional view illustrating the optical semiconductor device shown in FIG. 1.

FIG. 1 is a perspective view illustrating a semiconductor device in one embodiment of the present invention, and FIG. 2 is a sectional view illustrating the same optical semiconductor device. An n-type GaAs buffer layer 11 is grown on a (1 0 0) n-type GaAs substrate 10. Further, an epitaxial multilayer composed of an n-type $Al_{0.3}Ga_{0.7}As$ clad layer 12 having a thickness of 5 μm, an undoped multiple quantum well layer (ten periods of a pair of GaAs well layer having a thickness of 50 Å and $Al_{0.2}Ga_{0.8}As$ barrier layer having a thickness of 100 Å) 13, a p-type $Al_{0.3}Ga_{0.7}As$ clad layer 14 having a thickness of 2 μm and an p-type GaAs cap layer 15 having a thickness of 1 μm is provided on the buffer layer 11. Further, after a ridge is formed by wet etching an epitaxial multilayer up to n-type $Al_{0.3}Ga_{0.7}As$ clad layer 12 on one side of the ridge, an undoped $Al_{0.5}Ga_{0.5}As$ layer 31 having a thickness of 3 μm, an n-type $Al_{0.3}Ga_{0.7}As$ layer 32 having a thickness of 4 μm and an n-type GaAs cap layer 33 are grown in the mentioned order on the buffer layer 11, and on the other side of the ridge, an undoped $Al_{0.5}Ga_{0.5}As$ layer 31 having a thickness of 3 μm, a p-type $Al_{0.3}Ga_{0.7}As$ layer 34 having a thickness of 4 μm and an p-type GaAs cap layer 35 are grown in the mentioned order on the buffer layer 11. Further, a p-type electrode 42 for a first junction is provided on the p-type cap layer 15 at the top of the ridge, and an n-type electrode 45 for the first junction is provided at the bottom surface of the substrate 10. an n-type electrode 43 and a p-type electrode 44 for a second junction are provided on the cap layers 33, 35, respectively.

As shown in FIG. 2, a first junction A1, A2 are set between the multiple quantum well layer 13 and the p-type clad layer 14 and between the same well layer 13 and the n-type clad layer 12, in parallel with the upper surface of the substrate 10, and the second junction B1, B2 is set between the well layer 13 and the n-type layer 32 and the same well layer 13 and the p-type layer 34, perpendicular to the upper surface of the substrate 10.

Next explanation will be hereinbelow made of operation of the above-mentioned optical semiconductor layer.

A forward bias voltage is applied to the p-type and n-type electrodes 44, 43 for the second junction B1, B2 perpendicular to the upper surface of the substrate 10 so as to inject current to the multiple quantum well layer in order to excite laser. In this phase, a reverse bias voltage is applied to the p-type and n-type electrodes 42, 45 for the first junction A1, A2 parallel to the upper surface of the substrate 10. If the reverse bias voltage is increased, the wavelength of the excited laser is shifted toward a longer side of a wavelength range. That is, with a reverse bias voltage of 20 V, it is shifted by 100 Å. Further, a response speed for the shift is less than 1 ns, and no variation (fluctuation and oscillation) in wavelength after the shift is found while no large variation in the output occurs.

Figure 3A:
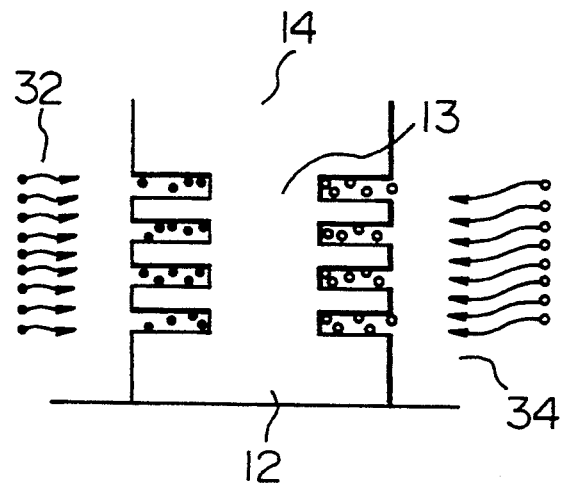

The reason why such a shift in wavelength occurs will be explained with reference to FIGS. 3a to 3c. When an electric field is applied to the multiple quantum well 13 serving as an active layer, an energy band is produced as shown in FIG. 3a so that the quantum well regions of the active layer 13 is selectively fed with holes and electrons from the p-type layer 34 and the n-type layer 32, respectively, and accordingly, the laser is excited, having a wavelength which is determined by a band gap in the active layer 13.

Figure 3B:
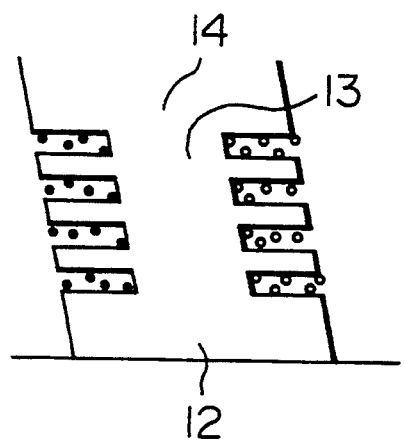
Figure 3C:
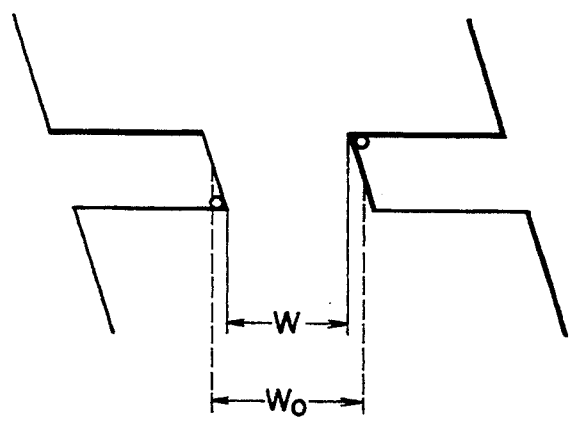

Then, a reverse bias voltage is applied between the P-type clad layer 14 and the n-type clad layer 12, and accordingly, a band is inclined as shown in FIG. 3b. Since an electron and a hole come to the bottoms of opposite wells, respectively, and since the band gap W between the electron and the hole become smaller than the actual band gap Wo, as shown in FIG. 3c which is an enlarged view, the wavelength of the thus excited laser becomes longer. The larger the reverse bias voltage, the greater the energy band is inclined, and the longer the wavelength of the excited laser becomes. Thus, the wavelength of excited laser can be changed by applying a reverse bias voltage between the p-type clad layer 14 and an n-type clad layer 12.

As mentioned above, the wavelength can be stably changed at a high speed. Further, although a semiconductor laser in a GaAS/AlGaAs group is used in the above-mentioned embodiment, the similar effect can be exhibited even with another semiconductor laser such as that in an InP/InGaAsP group.

Next explanation will be made hereinbelow a method of producing the optical semiconductor device in the above-mentioned embodiment shown in FIGS. 1 and 2.

Figure 4:
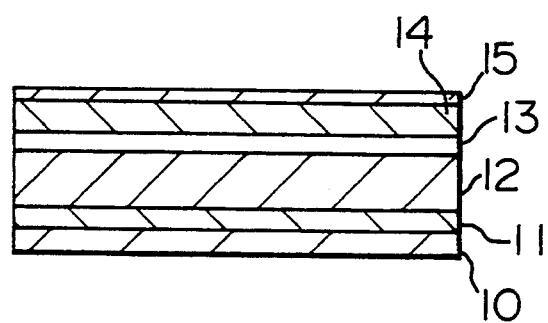
FIGS. 4 to 6 are sectional views for explaining a method of producing the optical semiconductor device shown in FIG. 1.
Figure 5:
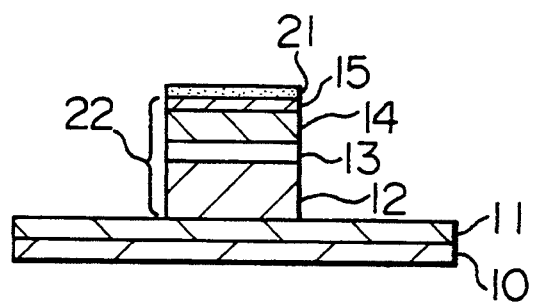
Figure 6:
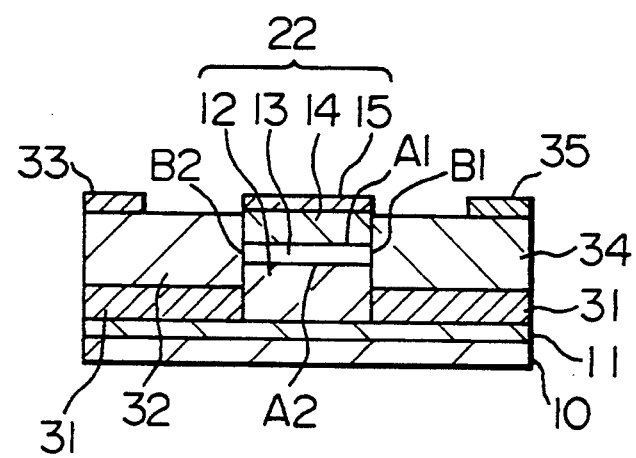

FIGS. 4 to 6 are sectional views for explaining the respective steps of fabricating the optical semiconductor device, which will be explained as follows:

Referring to FIG. 4, an n-type GaAs buffer layer 11 is grown on a (1 0 0) n-type GaAs substrate 10. Further, an epitaxial grown multilayer composed of an n-type $Al_{0.3}Ga_{0.7}As$ clad layer 12 having a thickness of 5 μm, an undope multiple quantum well layer (ten periods of a pair of GaAs well layer having a thickness of 50 Å and $Al_{0.2}Ga_{0.5}As$ barrier layer having a thickness of 100 Å) 13, a p-type $Al_{0.3}Ga_{0.7}As$ clad layer 14 having a thickness of 2 μm and a p-type GaAs cap layer 15 having a thickness of 1 μm is formed on the buffer layer 11. Then, an $SiO_2$ stripe pattern mask 21 having a period of 500 μm and a width of 2 μm is prepared by a lithographic process, and the epitaxial-grown multilayer is etched up to the n-type $Al_{0.3}Ga_{0.7}As$ clad layer 12 with the use of a wet-type etching process so that a ridge in which the first junction A1, A2 is formed having the multiple quantum well layer 13 as a junction part in parallel to the upper surface of the substrate 10.

In this phase, the $SiO_2$ stripe pattern mask is not yet removed, and is used as a mask for the next step of selective molecular growth. On both sides of the above-mentioned ridge 22, an undoped $Al_{0.5}Ga_{0.5}As$ layer 31 having a thickness of 3 μm is selectively grown. After one side of the ridge is covered with an $SiO_2$ mask while an n-type $Al_{0.3}Ga_{0.7}As$ layer 32 having a thickness of 4 μm and an n-type cap GaAs cap layer 33 having 1 μm are selectively grown in the mentioned order on the other side of the ridge 22.

Next, the SiO$_2$ mask is removed from the one side of the ridge 22 while the other side where the selective growth has been made, is covered with an SiO$_2$, and then, a p-type Al$_{0.3}$Ga$_{0.7}$As layer 34 having a thickness of 4 μm and a p-type GaAs cap layer 35 having a thickness of 1 μm are selectively grown in the mentioned order on the one side of the ridge 22. Accordingly, the ridge is completry burried, and a second junction B1, B2 is formed having the multiple quantum well layer as a junction part, perpendicular to the upper surface of the substrate 10. Thereafter, the SiO$_2$ mask is removed, and parts of the n-type and p-type GaAs gap layers 33, 35 on both sides of the ridge are etched by a width of 100 μm with the use of a lithographic process.

Next, an SiO$_2$ film 41 is covered to an area having a width of 75 μm on each side of the ridge, and then an P-type electrode having a width of 100 μm, for the first junction, is formed at the top of the ridge while an n-type and a p-type electrode 43, 44 are formed on the surfaces of the n-type and p-type GaAs cap layers 33, 35, respectively for the second junction. Further, an n-type electrode 45 for the first junction is formed on the bottom surface of the n-type GaAs substrate 10.

Finally, after scribing with a period of 500 μm is made in the stripe direction of the ridge, around the ridge 22 as a center, cleaving is made with a period of 300 μm, in a direction perpendicular to the stripe direction of the ridge.

Thus, the fabrication of the optical semiconductor device is completed. In the above-mentioned process, the regrowth is repeated by three times in order to obtain the second junction B1, B2 perpendicular to the upper surface of the substrate after the formation of the ridge. If a diffusion process or an ion plantation process is used as doping measures for the n-type and p-type Al$_{0.3}$Ga$_{0.7}$As layers for constituting the second junction perpendicular to the upper surface of the substrate 10, on both sides of the ridge, it is clear that only one regrowth is required therefor.

Figure 7:
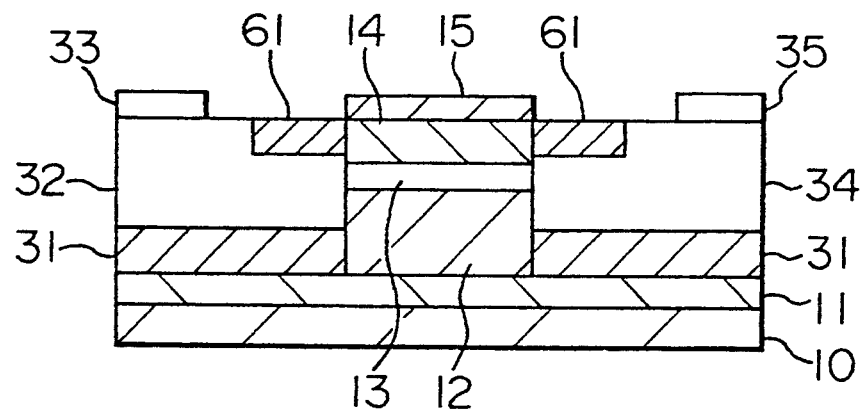
FIG. 7 is a sectional view illustrating a variant form of the optical semiconductor device shown in FIG. 1.
Figure 8:
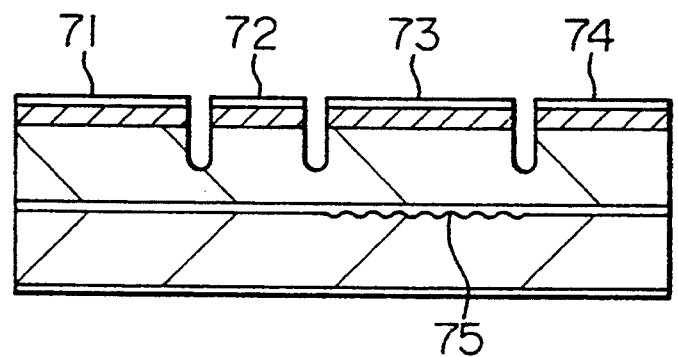
FIG. 8 is a sectional view illustrating a conventional optical semiconductor device.

Further, in order to enhance the isolation between the first junction A1, A2 parallel to the upper surface of the substrate and the second junction B1, B2 perpendicular to the upper surface of the substrate, as shown in FIG. 7, both sides of the ridge 22 are etched so as to form grooves after the formation of the two junctions (see FIG. 6). Further, if these grooves are filled with an undoped Al$_{0.5}$Ga$_{0.5}$As layer 61 which are selectively grown, the isolation can be further enhanced. Of course, the filling to the grooves is not absolutely necessary.

The reason why the isolation can be improved by etching both sides of the ridge so as to form grooves and by filling the undoped Al$_{0.5}$Ga$_{0.5}$As layer 61 formed by the selective growth in the grooves, is such that the electric field for controlling the wavelength of laser is applied to the active layer by a right angle thereto so that the electric field for effecting the emission can be isolated therefrom. Specifically, with the provision of the undoped layer 61 on both sides of the clad layer 14, the electric field which is applied to the active layer 13 by an voltage applied between the p-type electrode 44 and the n-type electrode 43 extends in a direction parallel to the upper surface of the substrate 10. That is, the applied voltage for emission can hardly affect upon the voltage for controlling the active layer 13.

In the optical semiconductor device according to the present invention, the active layer can be commonly used by the first and second junctions which can be driven, independent from each other, and the active layer can be driven and controlled by respectively using the first and second junctions so as to solve the serious problems inherent to conventional four electrode element type optical semiconductor devices which require a complicated circuitry, individual sensitive adjustment, extremely precise control of the temperature or the like, thereby it is possible to provide an optical semiconductor device which has a simplified drive circuit while eliminating the necessity of difficult and precise adjustment. Thus, the present invention can provide an optical semiconductor device having a high performance, which can be suitably used for optical communication and optical data processing.

What is claimed is:

1. A method of producing an optical semiconductor device comprising the steps:

growing an n-type buffer layer on an n-type substrate;

growing an n-type clad layer, a quantum well layer, a p-type clad layer and a p-type cap layer in the mentioned order on said n-type buffer layer and etching to form a ridge;

growing an undoped layer on said n-type buffer layer so as to be disposed on opposite sides of said ridge;

growing an n-type layer and an n-type cap layer in the mentioned order on said undoped layer on one side of said ridge;

growing a p-type layer and a p-type cap layer in the mentioned order on said undoped layer on the other side of said ridge;

respectively providing first junction electrodes on said p-type cap layer at the top of said ridge and the bottom surface of said substrate, and respectively providing second junction electrodes on said p-type cap layer and said n-type cap layer on both sides of said ridge.

* * * * *